United States Patent
Bryant et al.

(10) Patent No.: US 6,774,437 B2
(45) Date of Patent: Aug. 10, 2004

(54) FIN-BASED DOUBLE POLY DYNAMIC THRESHOLD CMOS FET WITH SPACER GATE AND METHOD OF FABRICATION

(75) Inventors: Andres Bryant, Essex Junction, VT (US); K. Paul Muller, Wappingers Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,486

(22) Filed: Jan. 7, 2002

(65) Prior Publication Data

US 2003/0127690 A1 Jul. 10, 2003

(51) Int. Cl.[7] .......................... H01L 27/04; H01L 29/94; H01L 31/062; H01L 31/119; H01L 31/113
(52) U.S. Cl. ...................... 257/350; 257/351; 257/353; 257/329; 257/330; 257/328
(58) Field of Search .................................. 257/350, 351, 257/353, 66, 72, 329, 330, 328

(56) References Cited

U.S. PATENT DOCUMENTS

| | | | |
|---|---|---|---|
| 5,729,039 A | * | 3/1998 | Beyer et al. ............... 257/347 |
| 5,780,899 A | | 7/1998 | Hu et al. |
| 6,100,565 A | | 8/2000 | Ueda |
| 6,100,567 A | | 8/2000 | Burr |
| 6,118,155 A | | 9/2000 | Voldman |
| 6,124,613 A | | 9/2000 | Kokubun |
| 6,154,091 A | | 11/2000 | Pennings et al. |
| 6,159,807 A | | 12/2000 | Bryant et al. |
| 6,177,708 B1 | | 1/2001 | Kuang et al. |
| 6,191,449 B1 | | 2/2001 | Shino |
| 6,204,532 B1 | | 3/2001 | Gambino et al. |
| 6,392,271 B1 | * | 5/2002 | Alavi et al. ............... 257/328 |

OTHER PUBLICATIONS

Hisamoto et al. (Finfet –A–Self–aligned double gate mosfet scalabe to 20nm), IEEE transactions on electron devices, vol. 47, No. 12, Dec. 2000.*
Liu et al. (Fabrication of FIn–type Double gate mosfet structure by orientation–dependent etching and electron beam lithography).*

* cited by examiner

Primary Examiner—Eddie Lee
Assistant Examiner—Samuel Gebremariam
(74) Attorney, Agent, or Firm—Schmeiser, Olsen & Watts; William D. Sabo

(57) ABSTRACT

The present invention provides a dynamic threshold (DT) CMOS FET and a method for forming the same that results in improved device performance and density. The preferred embodiment of the present invention provides a DT CMOS FET with a short, low resistance connection between the gate and the body and with low body-to-source/drain capacitance. The low body-to-source/drain capacitance is achieved using a thin, fin-type body. The low resistance connection between the gate and the body contact is achieved by having the gate and body contact aligned on opposite long sides of the fin with a bridge over the top of the narrow fin electrically connecting the gate and body.

18 Claims, 16 Drawing Sheets

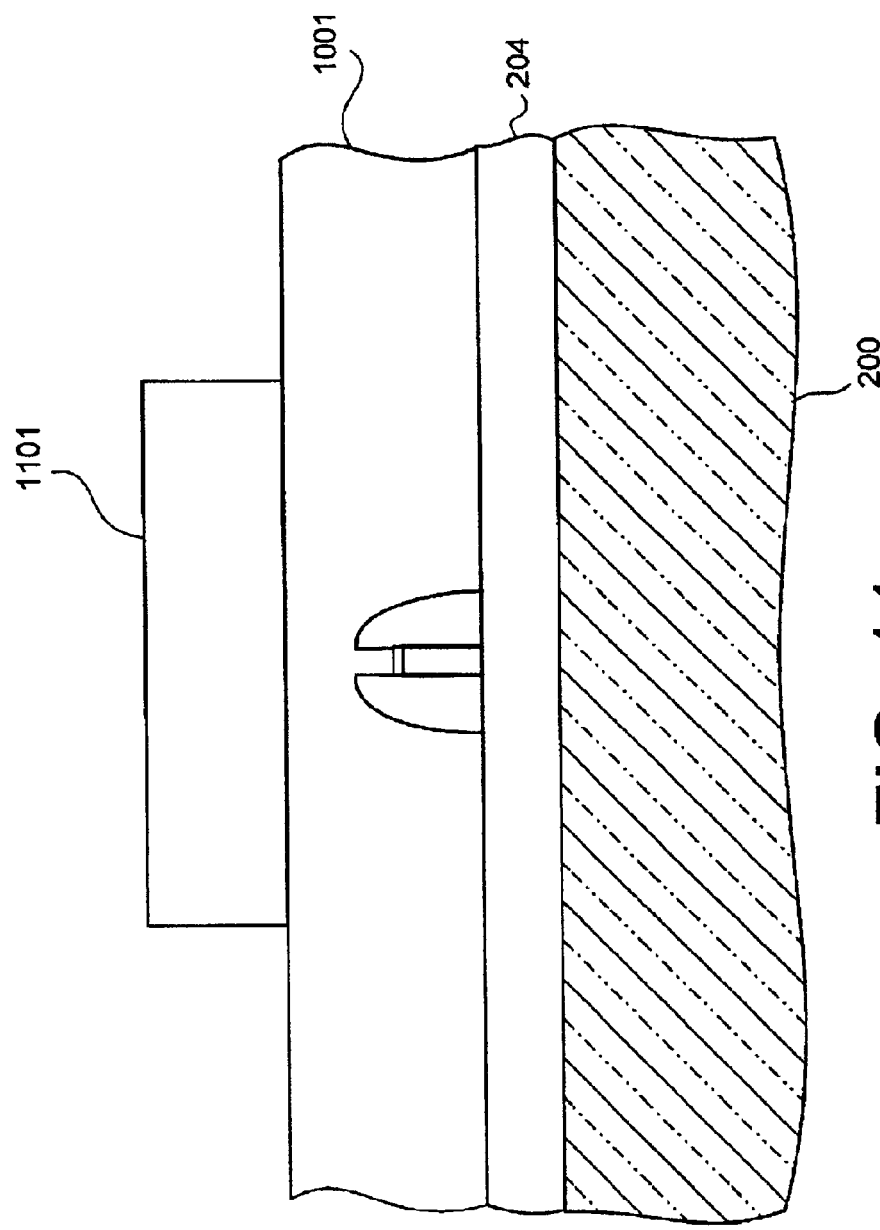

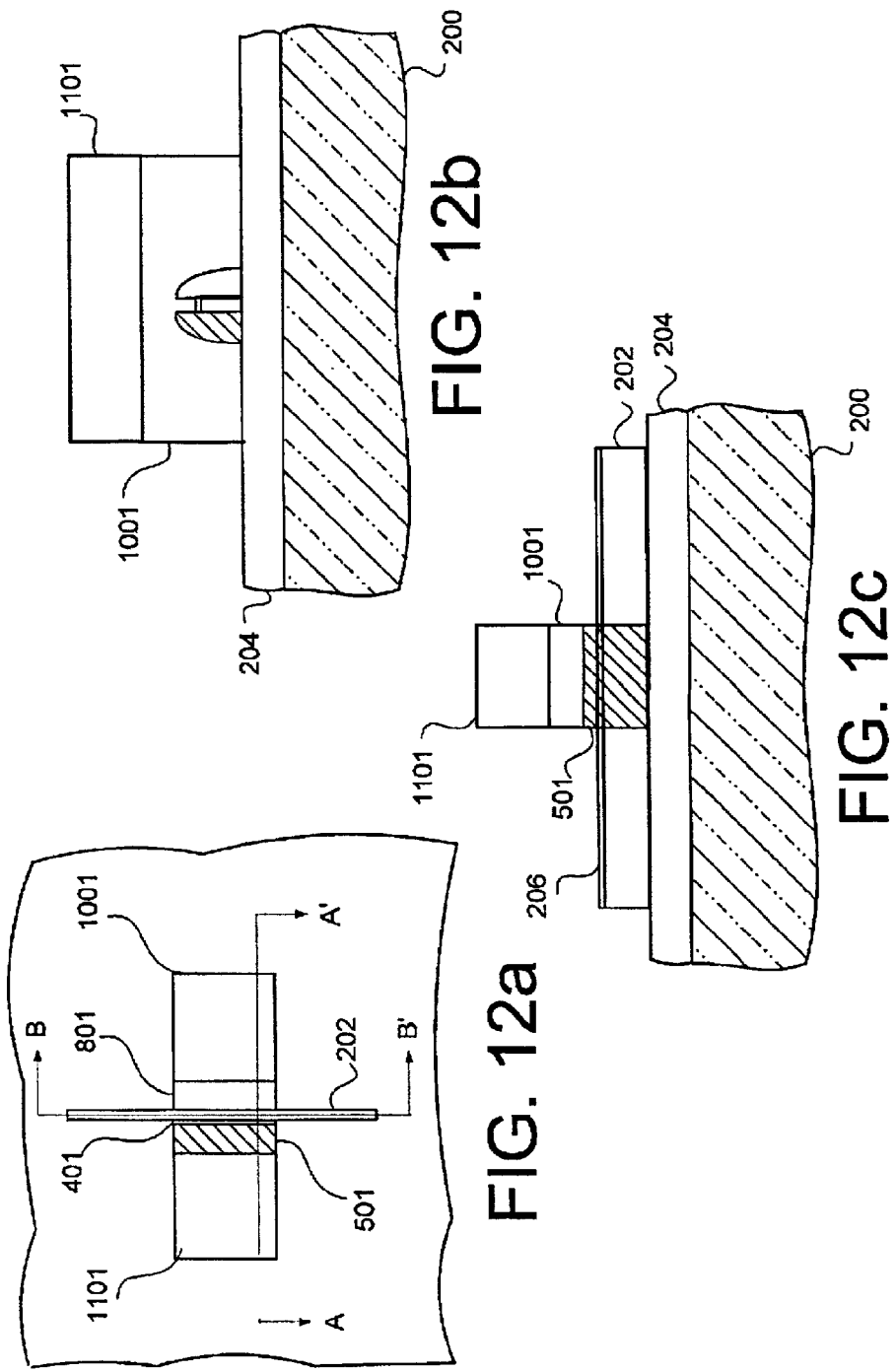

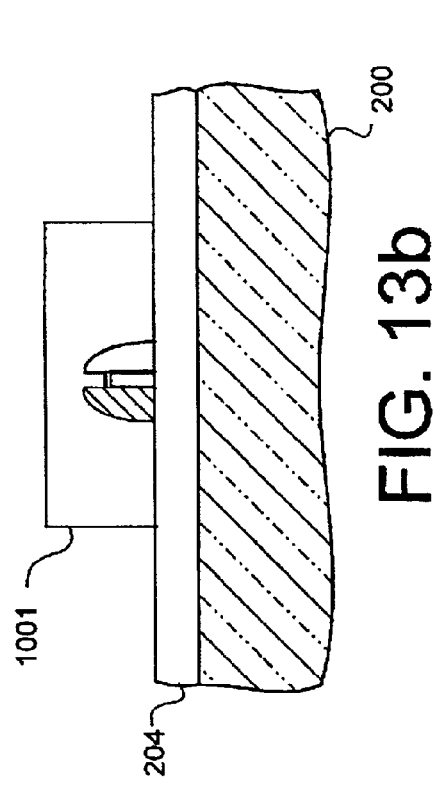
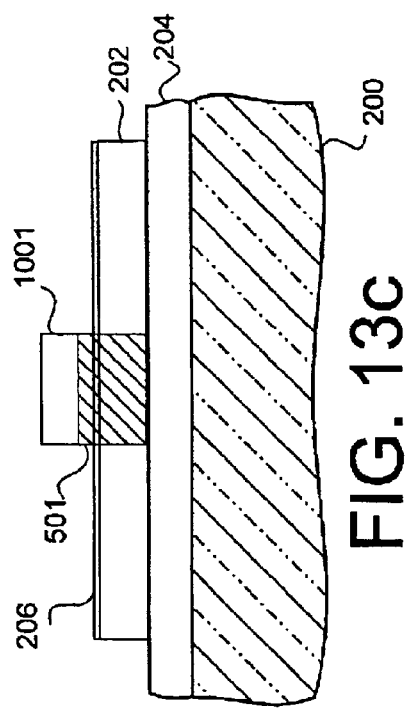
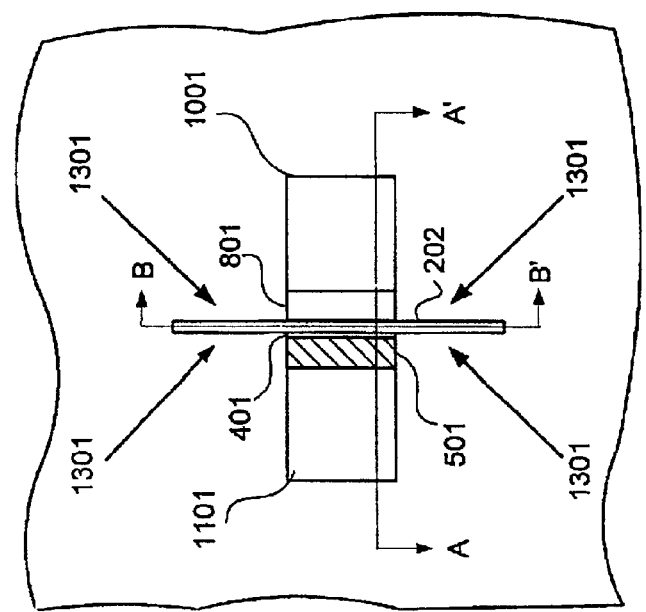

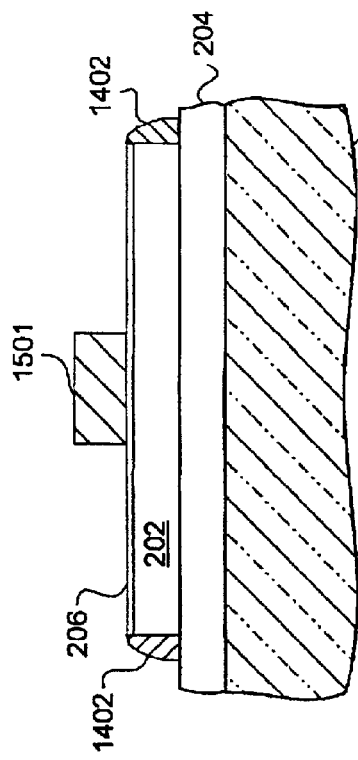
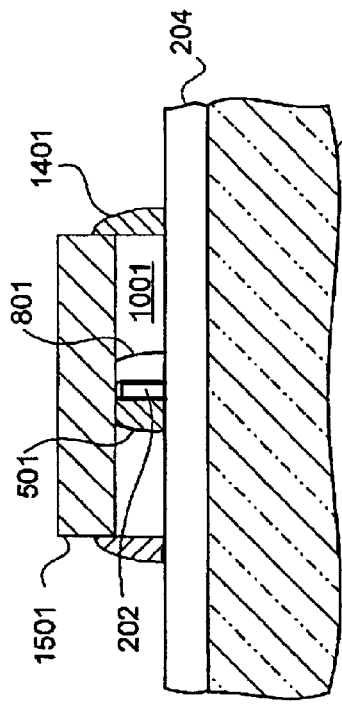
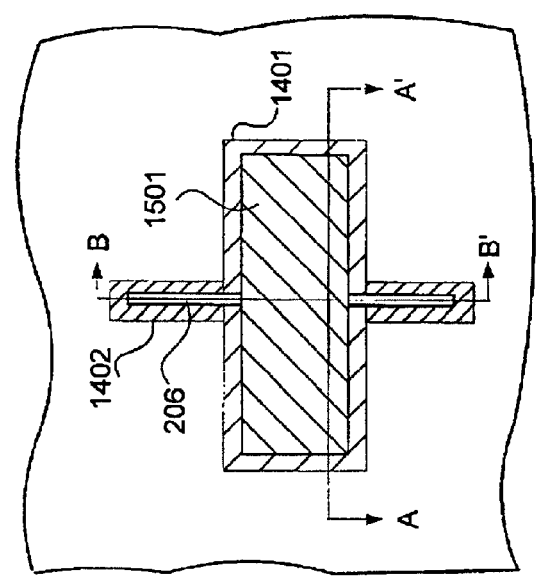

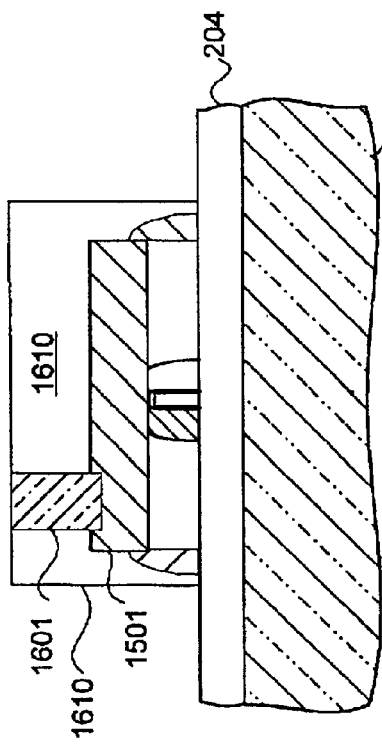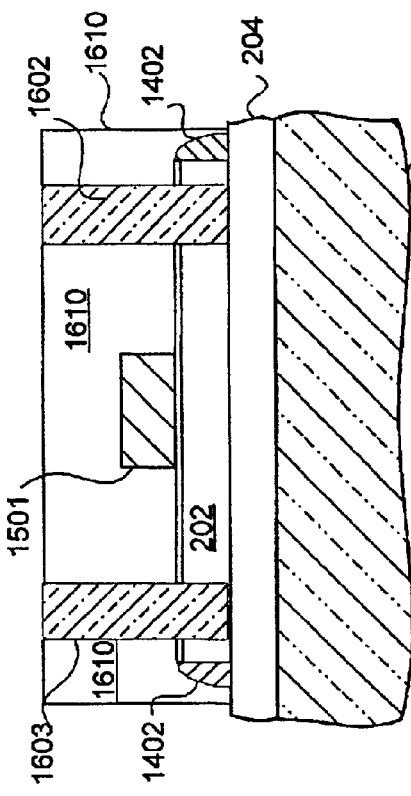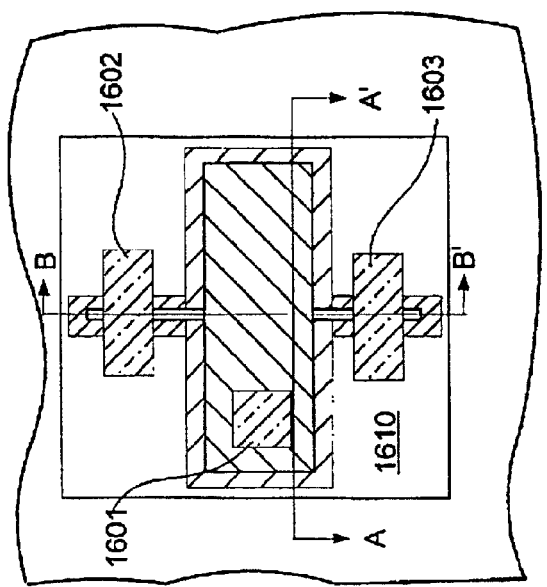

FIN-BASED DOUBLE POLY DYNAMIC THRESHOLD CMOS FET WITH SPACER GATE AND METHOD OF FABRICATION

BACKGROUND OF THE INVENTION

The present invention relates generally to the field of semiconductor manufacturing and, more specifically, to a dynamic threshold (DT) complementary metal oxide semiconductor (CMOS) field effect transistor (FET) device and method for forming same.

The need to remain cost and performance competitive in the production of semiconductor devices has caused continually increasing device density in integrated circuits. To facilitate the increase in device density, new technologies are constantly needed to allow the feature size of these semiconductor devices to be reduced. High device density also requires low-power operation.

The push for ever increasing device densities is particularly strong in CMOS technologies, such as in the design and fabrication of field effect transistors. FETs are used in almost all types of integrated circuit design (i.e., microprocessors, memory, etc.). Unfortunately, increased device density in CMOS FETs can result in degradation of performance and/or reliability.

One type of FET that has been proposed to facilitate increased device density is a dynamic threshold CMOS field effect transistor. Dynamic thresholding is achieved by electrically connecting the gate to the body, so that the body voltage moves with the gate voltage, lowering the threshold voltage when a signal is present. Dynamic thresholding provides faster response time and lower power consumption for the FET. Threshold voltage (Vt) is high in the off-state, limiting power leakage, and low in the on-state, limiting power requirements. CMOS generally uses less power than ordinary MOS. Dynamic threshold CMOS uses less power than standard CMOS.

Unfortunately, several difficulties arise in the design and fabrication of DT CMOS FETs. First, the connection between the gate and the body contact in prior art DT CMOS FETs is inevitably a long, high-resistance path. That high resistance degrades the response time of the circuit. Second, the body-to-source/drain capacitance in existing DT CMOS FETs limits the speed of the circuit. Neither result is desirable in CMOS applications. Unfortunately, these two practical limitations counterbalance the response time increase otherwise available from dynamic threshold CMOS.

Thus, there is a need for improved device structures and methods of fabrications of DT CMOS devices that provide dynamic threshold operation without paying the performance cost of high resistance gate-body contact and high body-to-source/drain capacitance. Only then can the full potential of DT CMOS be realized.

BRIEF SUMMARY OF THE INVENTION

In a first aspect the invention comprises a method for forming a transistor, the method comprising the steps of a) providing a semiconductor substrate; b) patterning the semiconductor substrate to provide a first body edge; c) providing a gate structure adjacent the first body edge; d) patterning the semiconductor substrate to provide a second body edge, the first and second body edges of the semiconductor substrate defining a transistor body; e) providing a body contact structure adjacent the second body edge aligned to the gate structure; and f) providing an electrically connective bridge between the gate structure and the body contact structure over the transistor body.

In a second aspect, the invention comprises A transistor comprising: a) a transistor body formed on a substrate, the transistor body having a first vertical edge and a second vertical edge; b) a gate structure adjacent the transistor body first vertical edge; c) a body contact structure adjacent the transistor body second vertical edge and aligned with the gate; d) a bridge over the body, the gate, and the body contact, electrically connecting the gate and the body contact; and e) source and drain regions in the body on opposite ends of the body.

Accordingly, the present invention provides a fin-based dynamic threshold (DT) complimentary metal oxide semiconductor (CMOS) field effect transistor (FET) and methods for forming same that results in improved device performance and density. The method and apparatus applies to both nFETs and pFETs.

The foregoing and other advantages and features of the invention will be apparent from the following more particular description of a preferred embodiment of the invention, as illustrated in the accompanying drawings.

BRIEF DESCRIPTION OF THE SEVERAL VIEWS OF THE DRAWINGS

The preferred exemplary embodiment of the present invention will hereinafter be in conjunction with the appended drawings, where like designations denote like elements, FIGS. 2–16 are views of an exemplary DT CMOS FET during the steps of fabrication.

DETAILED DESCRIPTION OF THE INVENTION

Accordingly, the present invention provides a dynamic threshold (DT) complimentary metal oxide semiconductor (CMOS) field-effect transistor (FET) and a method for forming the same that results in improved device performance and density. The preferred embodiment of the present invention provides a DT CMOS FET on a semiconductor body with a gate on a first long side, a body contact an the opposite long side, and a bridge over the body electrically connecting the gate and the body contact. The gate and body contact are located between the source and drain portions of the FET. The source and drain are formed by ion implantation doping when the body is exposed.

The preferred embodiment of the present invention is implemented using a fin structure. Fin-based DT CMOS FETs feature a long, thin semiconductor body vertically disposed on a substrate. Vertical orientation of the fin reduces the planar area occupied by the DT CMOS FET on the chip. On this fin structure, the insulated gate is formed on one long side of the body, and the body contact is located on the opposite long side of the body, with the transistor body being disposed horizontally between the gate and the body contact. The gate and the body contact are electrically connected by a bridge over the body. Because the body is thin between the gate and the body contact, the bridge provides a short, low resistance path. The thin fin body also reduces body-to-source/drain capacitance. The ends of the fin, outside of the region of the gate and body contact, are appropriately doped to provide source and drain regions.

The preferred method for forming these DT CMOS FETs allows the gate length of the device to have minimum feature size, while allowing the thickness of the body to be much smaller than the gate length (preferably less than one-third of the gate length). The preferred method for forming the DT CMOS FET is accomplished by using an image enhancement technique, sidewall image transfer, to define the thickness of the transistor body, allowing it to be reliably formed at sub minimum feature size.

Figure 1:
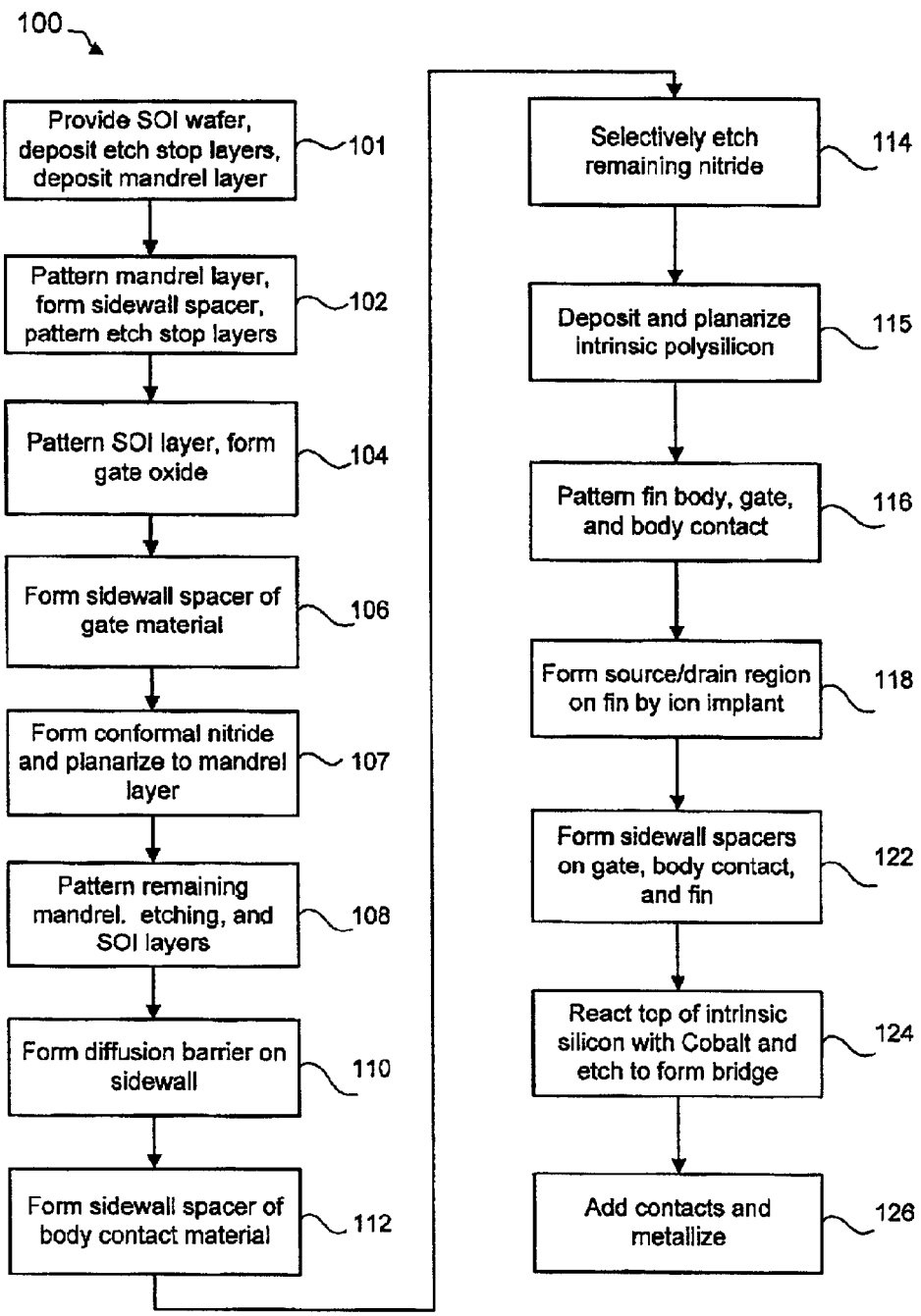
FIG. 1 is a process flow chart showing the exemplary steps of fabrication of a DT CMOS FET.

Turning now to FIG. 1, the steps of the method for forming an exemplary DT CMOS FET in accordance with the preferred embodiment are illustrated. The method forms a DT CMOS FET in a way that improves the response time of the transistor, while maintaining fabrication reliability and simplicity.

Figure 2:
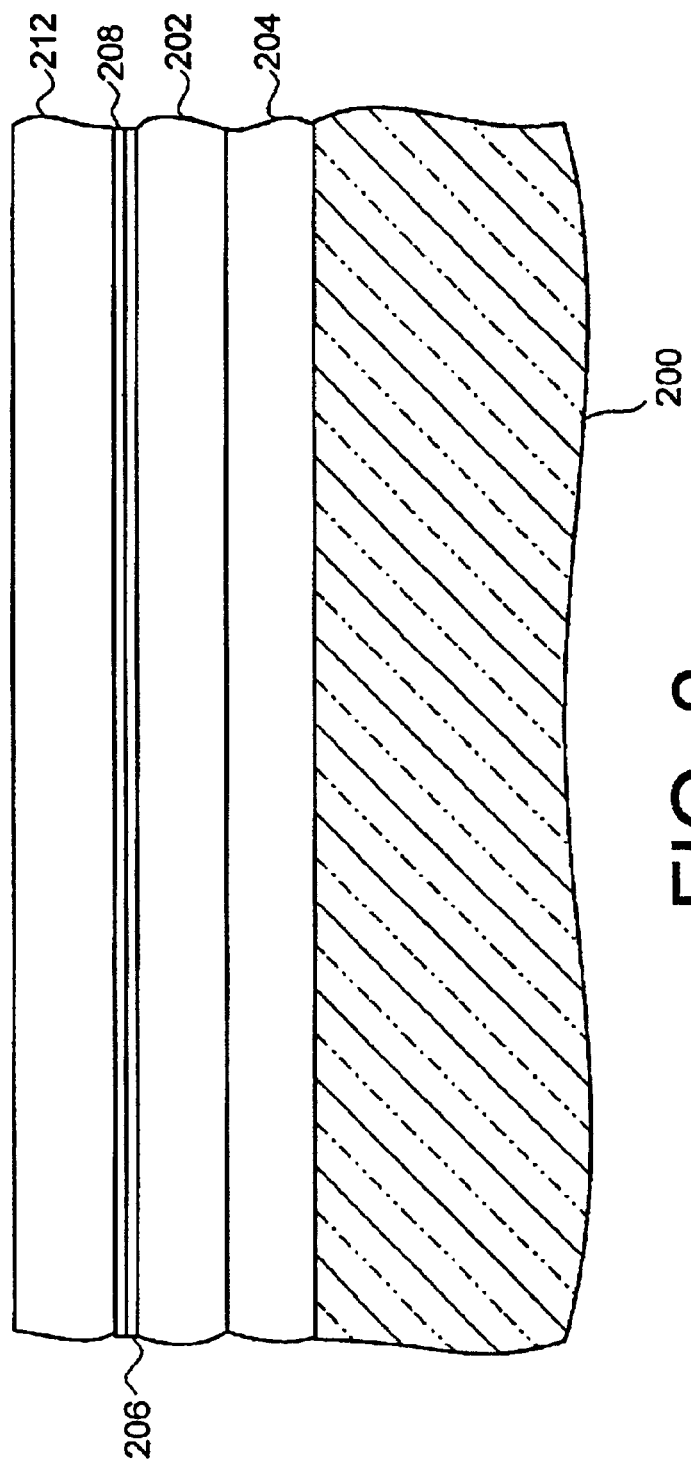

The first step 101 is to provide, as illustrated by example in FIG. 2, an appropriate wafer 200, 204, and 202, deposit etch stop layers 206 and 208, and deposit a mandrel layer 212. In the preferred embodiment, the wafer used comprises a silicon 202 on insulator 204 (SOI) wafer. As such, the wafer comprises a substrate 200 beneath a bottom oxide layer 204 beneath a single crystal silicon layer 202. The bottom oxide 204 and single crystal silicon layer 202 together form the SOI layer. As will become clear, the single crystal silicon layer 202 is used to form the fin body of the DT CMOS FET.

With a SOI wafer provided, an etch stop layer is deposited, comprising an oxide layer 206 on the silicon layer 202 and silicon nitride 208 on top of that oxide layer 206. The etch stop layer will be used for etch stopping and creating an insulator on the top of the fin in the final product. A mandrel layer 212 is then formed on the nitride 208, preferably comprising silicon dioxide. This mandrel layer 212 will be used in the fabrication process as a block mask for defining a first edge to the fin and for supporting a sidewall spacer used in sidewall image transfer.

Figure 3:
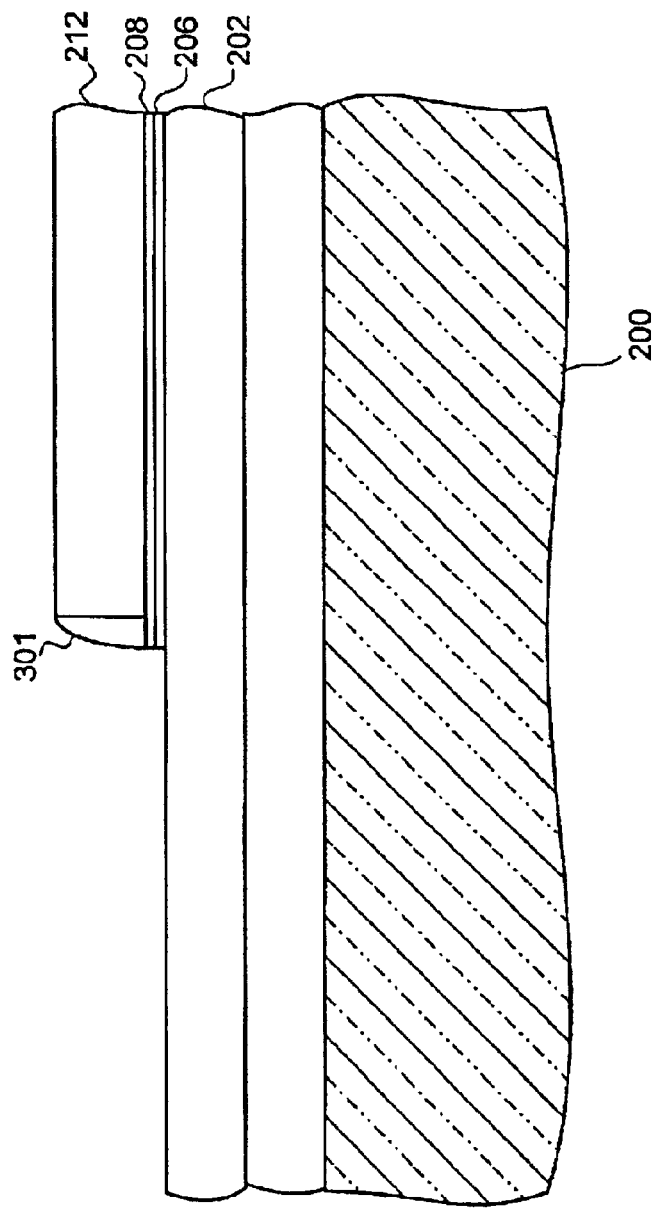

In step 102, referring to the example in FIG. 3, an unmasked portion of the silicon dioxide mandrel layer 212 is vertically etched to the etch stop layer 208. Maintaining the etch stop layer is important because etch stop layer 206 will later become the insulator between the bridge and the body of the transistor. The thickness of the silicon dioxide layer 212 should be greater than the desired width of the spacer 301 to be formed in the next step, in order to make the width of spacer 301 insensitive to the thickness of layer 212.

Next, a silicon nitride sidewall spacer 301 is formed on the side of the silicon dioxide layer 212 using the method well known in the art of conformally coating the sidewall area with silicon nitride (not shown) and then vertically etching to leave a sidewall spacer 301 in place. The anisotropic etching which forms the silicon nitride sidewall spacer 301 also etches through the silicon nitride etch stop layer 208. A subsequent masked anisotropic etching of the silicon dioxide 206 selective to silicon nitride 208, 301 and silicon reaches the single crystal silicon layer 202. The sidewall spacer 301 rests upon a portion of the etch stop layer 208.

Figure 4:
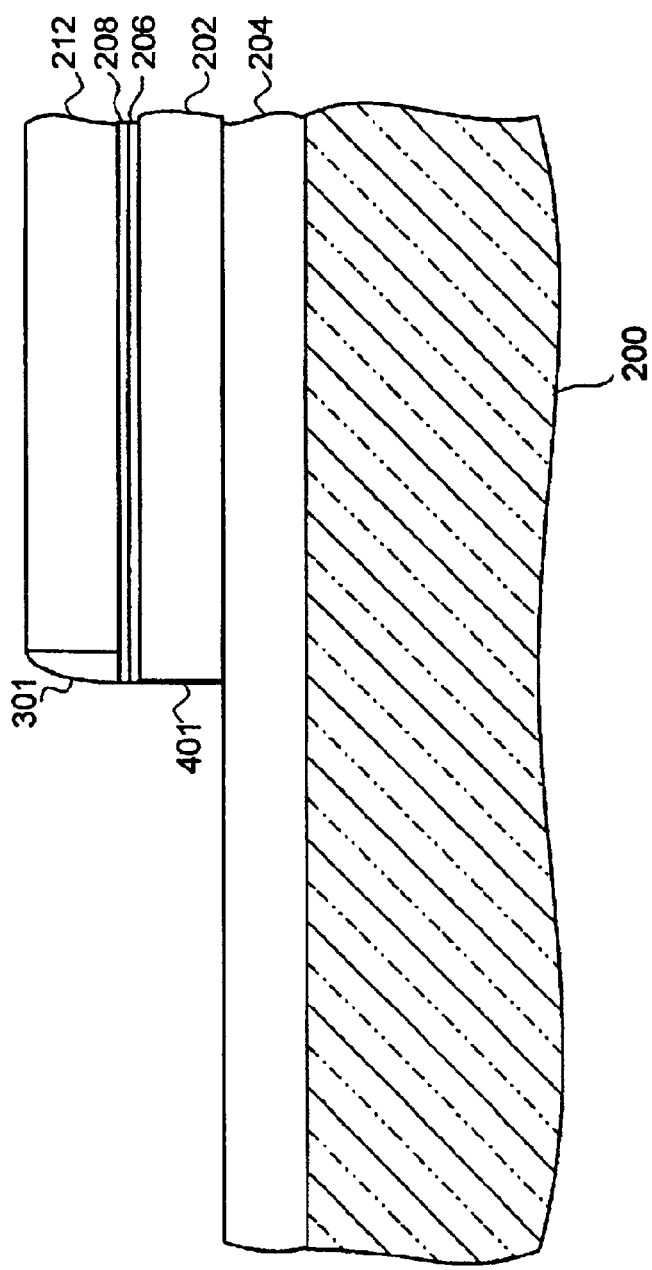

Turning now to FIG. 4, a exemplary wafer portion is illustrated after the formation of the silicon nitride sidewall spacer 301. In step 104, the silicon layer 202 is etched, selective to silicon nitride, to reach the bottom oxide layer 204 and expose a first edge of silicon 202 which will become a long side of the fin structure. Next, a gate oxide 401 is formed on the silicon 202 sidewall by forming a first, sacrificial oxide, wet-stripping it, and then forming the gate oxide 401. The gate oxide 401 will ultimately become the insulator for the gate.

Figure 5:
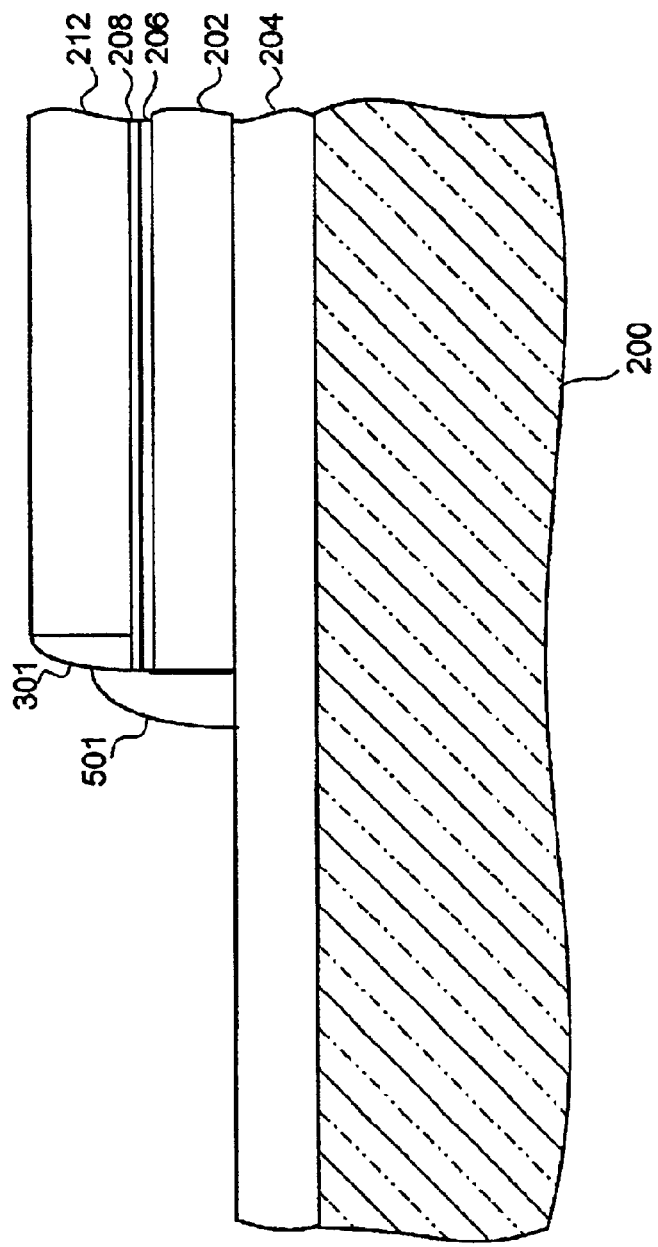

As shown by example in FIG. 5 and according to step 106, an n+ polysilicon sidewall spacer 501 is formed over the gate oxide 401, the etch stop layers 206 and 208 and silicon nitride spacer 301 upon the bottom oxide layer 204. The top of the n+ polysilicon spacer 501 is formed below the level of the top of the silicon dioxide layer 212. The n+ polysilicon spacer 501 will eventually become the gate.

Figure 6:
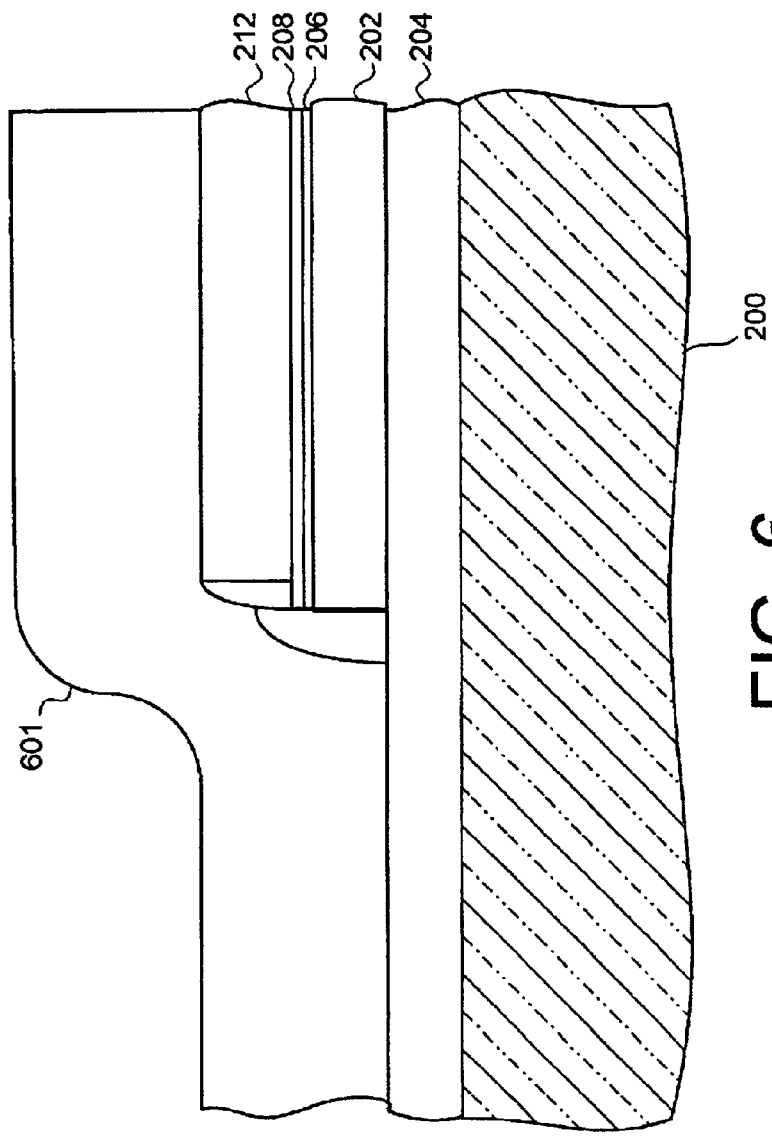

Turning now to FIG. 6 we see an example of the results of step 107. In step 107, a silicon nitride conformal coating 601 is formed over the bottom oxide 204, the mandrel layer 212, and the structures in between 301 501. This layer 601 must have a thickness greater than the top of the mandrel layer 212 relative to the top of the bottom oxide 202.

Figure 7:
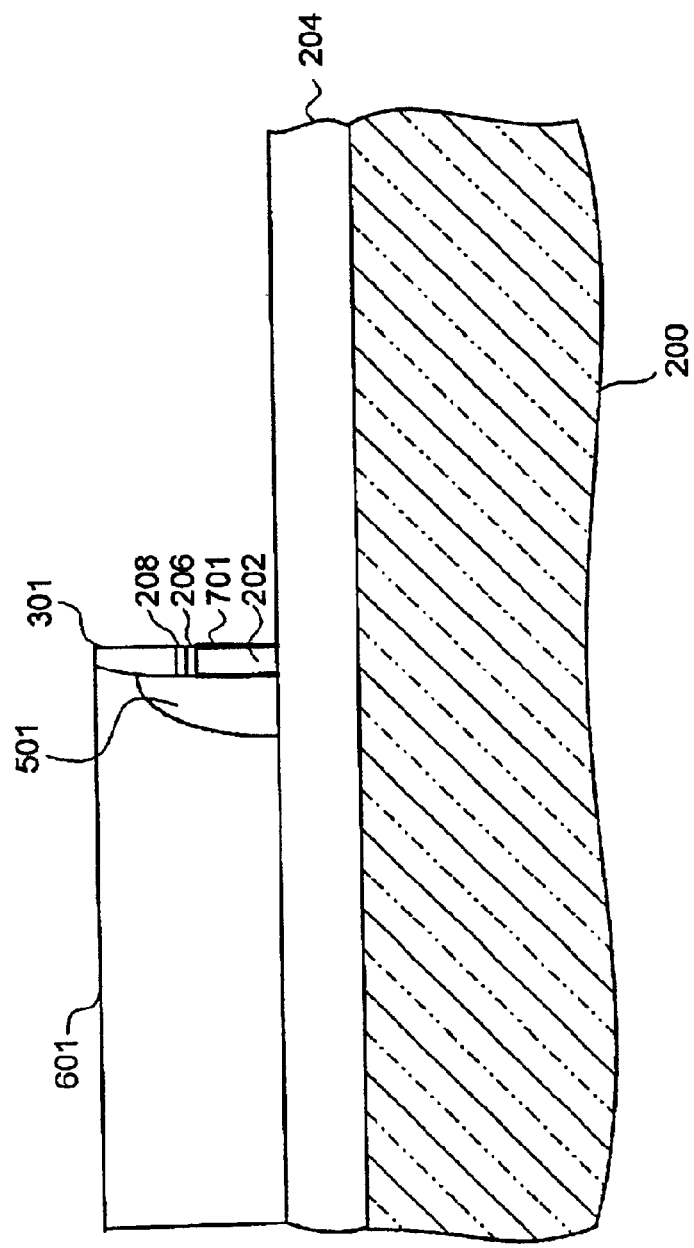

The conformal silicon nitride 601 is planarized, as shown in the example of FIG. 7, to below the top of the silicon dioxide mandrel layer 212 by chemical mechanical planarization (CMP) and reactive ion etch (RIE). The depth of planarization is not sufficient to expose the n+ polysilicon sidewall spacer 501 which becomes the gate electrode but does expose the original silicon nitride sidewall spacer 301.

Referring again to FIG. 7 to illustrate by example step 108, the portion of the silicon dioxide mandrel layer 212 exposed by planarization is vertically etched selective to silicon nitride 301, 601 to the etch stop layer. The top etch stop layer 208 is vertically (anisotopically) etched selective to silicon dioxide 206. The silicon dioxide etch stop layer 206 is anisotropically etched selective to silicon 202. The silicon layer 202, exclusive of the portion below the silicon nitride spacer 301 and the remnants of the etch stop layer 206, 208 is anisotropically etched selectively with respect to silicon nitride 301, 601. This process exposes a second edge of the transistor fin body 202, being a second long sidewall of the fin structure. Hereinafter, the single crystal silicon layer remnant 202 is the fin 202.

As illustrated by example in FIG. 7, in step 110, a native oxide 701 is formed by atomic layer oxidation on the silicon 202 sidewall as a diffusion barrier 701. This formation can be by exposure to air or the oxidation can be compelled. The oxide layer 701 serves as a barrier to the diffusion of Boron from the yet-to-be-formed p+ polysilicon body contact 801 into the single crystal silicon 202 during subsequent annealing steps.

Figure 8:
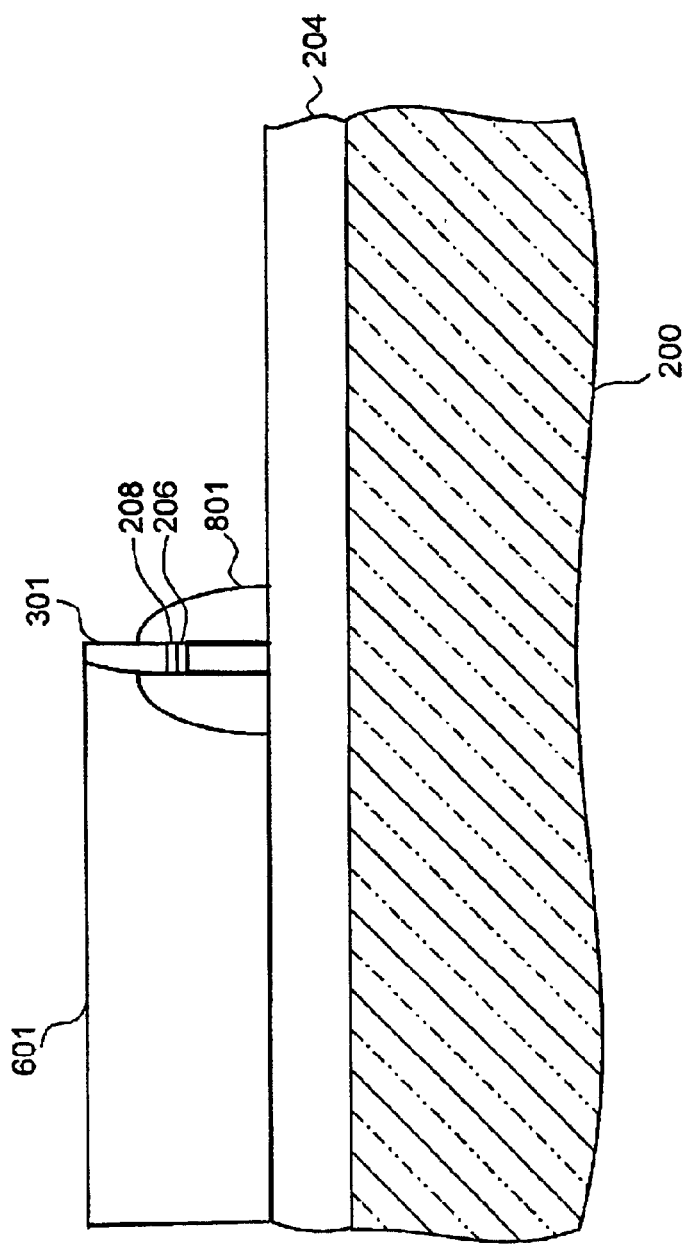

In step 112, as shown in the example of FIG. 8, a p+ polysilicon sidewall spacer 801 is formed against the second sidewall's native oxide layer 701, the etch stop layers 206 208, the silicon nitride sidewall spacer 30, and upon the bottom oxide layer 204. This sidewall spacer will become the body contact electrode 801. The p+ polysilicon 801 can be doped before or after deposition.

Figure 9:
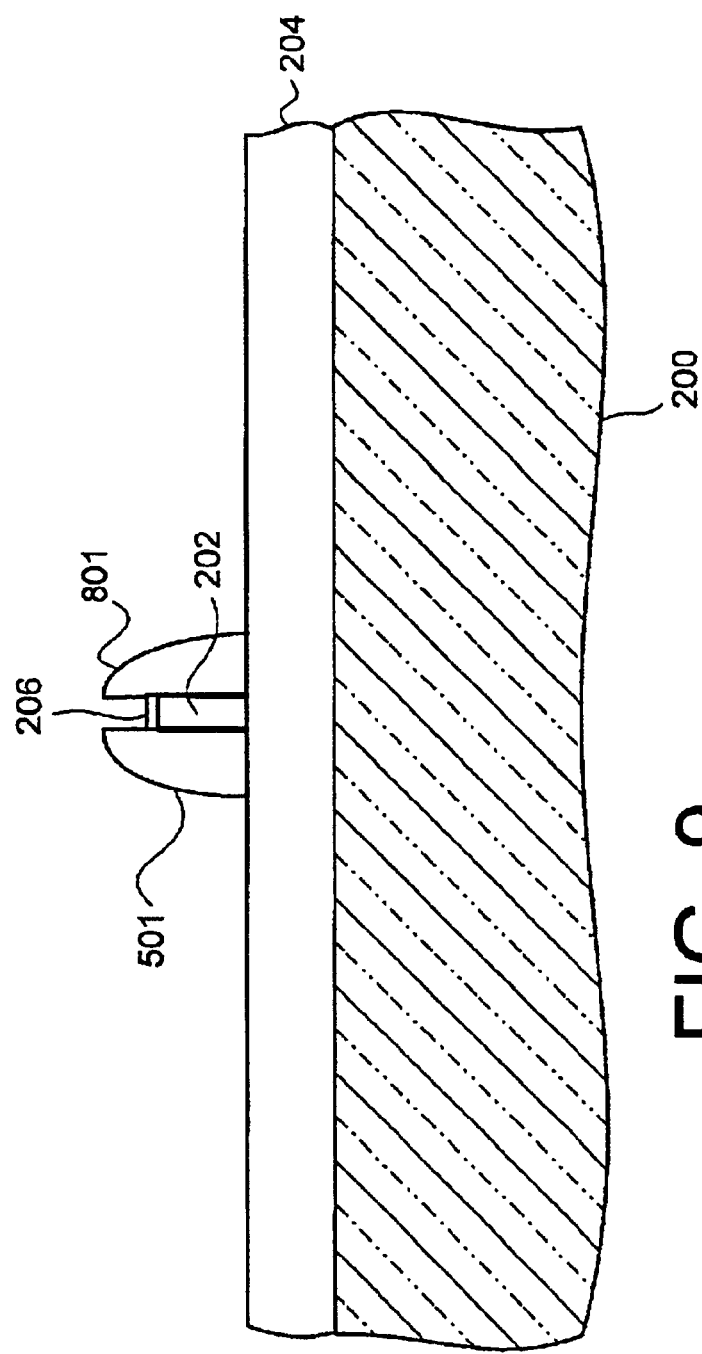

Turning now to the example of FIG. 9, in executing step 114, the remaining silicon nitride 601, 301, 208 is etched selectively with respect to polysilicon 501, 801 and silicon dioxide 204, 206. The silicon nitride of the original sidewall spacer 301 and the silicon nitride of the etch stop layer 208 are etched away in this step. The silicon dioxide layer 206 of the etch stop layer remains on the top of the fin 202 to form an insulator 206 between the fin 202 and yet-to-be-formed bridge 1501.

Figure 10:
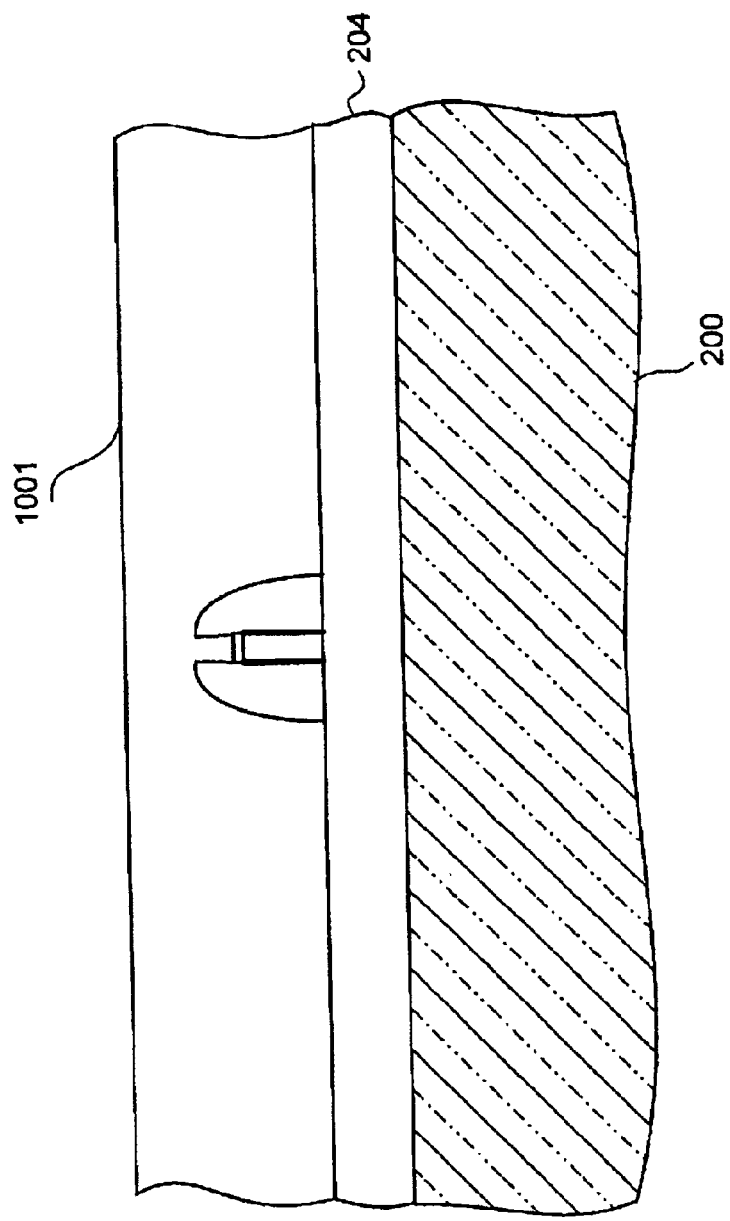

In step 115, as shown in the example of FIG. 10, an intrinsic polysilicon 1001 is deposited and planarized to a level higher than the n+ and p+ polysilicon sidewall spacers 501, 801. The purpose of layer 1001 is to provide a flat surface for a photolithography mask.

In step 16, as shown in the example of FIG. 11, a photo resist 1101 is added and patterned via photo lithography.

Negative or positive photo resist may be used. This is preferably done using standard lithographic techniques, i.e, depositing and patterning a hardmask, and then using the patterned hardmask as an etch block during an etching of the exposed materials.

Continuing with step 116, the exposed portions of the photo resist 1101 are etched as shown in the example of FIG. 12. The polysilicon spacers 501, 801 are etched to define the gate 501 length and body contact 801 length and to expose the fin body 202. The gate 501 length should be greater than three times the thickness of the fin 202. FIG. 12a shows a plan view of the device after etching the pattern through a photo resist 1101 mask. In the augmented plan view, the gate 501, gate insulator 401, body contact 801, intrinsic silicon 1001 and the portion of the fin 202 between the gate 501 and the body contact 801 are shown in addition to the standard view. A standard top view would not reveal these features as they are covered by intrinsic silicon 1001 and photo resist 1101 as shown in FIG. 12b. The gate 501 is shown as a hatched region in all three views. Two sectional views are defined. FIG. 12b illustrates a vertical sectional view (A–A'), transverse to the fin's 202 long axis and through the polysilicon spacers 501, 801, after etching away the exposed intrinsic polysilicon 1001 to provide side isolation regions. FIG. 12c is an augmented vertical sectional view (B–B') through the fin's 202 long axis also showing the polysilicon gate 501 and the unexposed photo resist 1101. This view shows the result of etching the intrinsic silicon 1001, n+ polysilicon 501, and p+ polysilicon 801 through a resist mask to define the side boundaries of the gate 501 and body contact 801 and to expose the fin body 202 outside of the side boundaries of gate 501 and body contact 801. The etching is anisotropic and selective against silicon dioxide to protect the fin 202 top insulator 206 and the bottom oxide 204.

Turning to the example in FIG. 13 in reference to step 118, the photo resist 1101 is stripped away and ion implants are made in the source and drain end regions of the fin. FIG. 13a is an augmented plan view of the device showing the directions 1301 for ion implantation. Gate 501 is shown as a hatched region in all three views. Two sectional views are defined. FIG. 13b illustrates a vertical sectional view (A–A') transverse to the fin's 202 long axis and through the polysilicon spacers 501, 801 and remaining intrinsic polysilicon 1001. FIG. 13c is an augmented vertical sectional view (B–B') through the fin 202 and along its long axis showing the remaining intrinsic silicon 1001 and additionally showing the gate 501 which is behind the sectional plane. The exposed ends of the silicon fin 202 are doped using an ion implant technique from four angles, forty-five degrees from the fin axis. This produces uniformity of doping density. Arsenic ions are implanted for nFETs and Boron ions are implanted for pFETs. Those skilled in the art will appreciate that ion implantation can take place at any point in the process when a sidewall of the fin 202 is exposed, such as before the gate oxide 401 is formed and before the diffusion barrier native oxide 701 is formed.

Figure 14B:
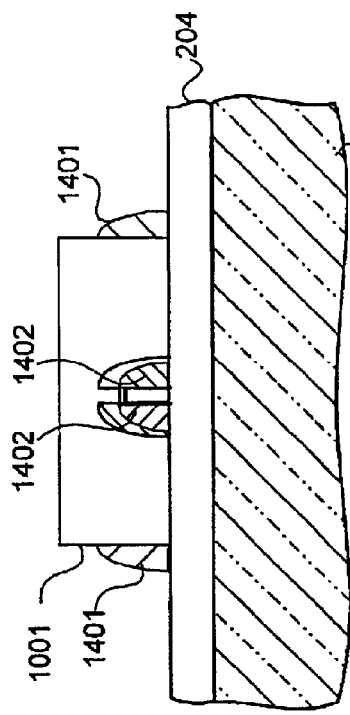
Figure 14C:
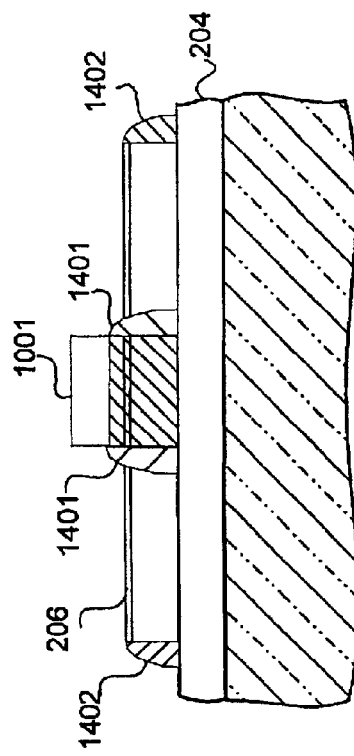
Figure 14A:
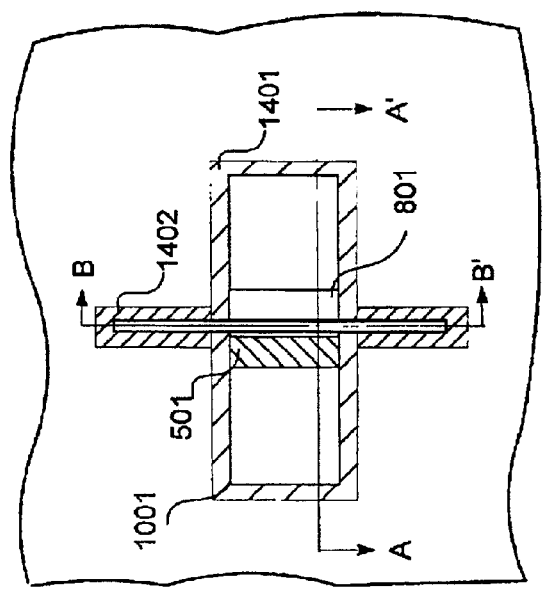

In step 122, as illustrated in the example of FIG. 14, sidewall spacers 1402 are added to the exposed portions of the fin 202. Sidewall spacers 1401 are added to the sides of the gate 501 and body contact 801, and to the intrinsic polysilicon mesa 1001 which encloses the remaining portions of the gate 501 and the body contact 801. FIG. 14a is an augmented plan view of the device showing the addition of silicon nitride sidewall spacers 1401 to the sides of the polysilicon electrodes and the sidewalls of the intrinsic polysilicon mesa. The sidewall spacers 1401 are shown cross hatched differently from the gate in all three views. Silicon nitride sidewall spacers 1402 cover the sides and ends of the fin. Because fin spacers 1402 and gate-side spacers 1401 are of different heights, there are multiple sub-steps within step 122 to accomplish the result. Two sectional views of FIG. 14a are defined. FIG. 14b is an augmented vertical section (A–A') through the polysilicon gate 501 and body contact 801 and transverse to the long axis of the fin 202. Additionally, FIG. 14b shows the sidewall spacers 1402 which are out of the sectional plane. The silicon nitride spacers 1401, 1402 are formed by conformal deposition and anisotropic etching. The spacers are formed on each side of the gate 501 and body contact 801 and along the sidewalls of the intrinsic polysilicon 1001. FIG. 14c is an augmented vertical sectional view (B–B') along the long axis of the fin 202 showing the remaining intrinsic silicon 1001 and the fin's 202 end spacers 1402. Additionally, FIG. 14c shows the gate 501 and its side spacers 1401 which are not in the sectional plane.

Turning to the example in FIG. 15 to illustrate step 124, a metal silicide bridge 1501 is formed on top of the intrinsic polysilicon mesa 1001. FIG. 15a is a plan view of the device showing a metal silicide bridge 1501 on the intrinsic silicon 1001, the sidewall spacers 1401 and 1402, and the insulator 206 on top of the fin 202. In the preferred embodiment, the bridge is formed by deposition of cobalt and subsequent annealing to form cobalt silicide. The thickness of the cobalt layer is chosen to ensure that cobalt silicide forms to a depth sufficient to contact out-diffused n+ and p+ regions of intrinsic polysilicon above the n+ polysilicon 501 and p+ polysilicon 801 spacers. This ensures good electrical contact between the gate and the body contact. Unreacted cobalt is selectively etched away to leave only cobalt silicide. FIG. 15b is a sectional view (A–A') showing the cobalt silicide bridge 1501 being insulated from the fin 202 by the oxide layer remnant 206 (not labeled) and further showing the connection between the gate 501 and the body contact 801 by the bridge 1501. FIG. 15c is a vertical sectional view (B–B') along the long axis of the fin 202 showing the bridge 1501 insulated from the fin 202 by the oxide layer 206.

Referring to the example in FIG. 16 to illustrate step 126, the gate contact 1601, source contact 1602, and drain contact 1603 are formed. FIG. 16a is a plan view of the device after contacts 1601–1603 have been formed. FIG. 16b is a vertical section view (A–A') transverse to the long axis of the fin 202 and through the polysilicon structures 501 and 801 showing the contact 1601 for the gate 501. The contact is formed by deposition and planarization of an insulator (silicon dioxide) 1610 on the device, etching of contact holes in the silicon dioxide into the cobalt silicide layer, and filling the etched holes with tungsten. FIG. 16c shows a vertical sectional view (B–B') along the long axis of the fin 202 with source and drain contacts 1602–1603 but without showing the gate contact 1601, which is out of the sectional plane. The source and drain contacts 1602–1603 are formed by means similar to the means used to form the gate contact but there is no cobalt silicide on the source and drain regions of the fin 202. The etching of the contact holes removes the portions of the fin's 202 silicon nitride sidewall spacers 1402 that cover the source and drain regions. The contacts 1602–1603 connect directly with the doped silicon source and drain regions of the fin 202. The source and drain contacts 1602–1603 may be formed at the same time as the gate contact 1601 or as an additional step.

Following the creation of the contacts, metalization follows to form interconnects to other transistors (not shown).

The preferred embodiment of the present invention was implemented using a fin type structure 202. The fin-based DT CMOS FET featured a long, thin semiconductor body 202 vertically disposed on a substrate, also known as a fin 202. Vertical orientation of the fin reduced the planar area occupied by the DT CMOS FET on the chip. On this fin structure 202, the gate 501 was formed on one long side of the body 202, and the body contact 801 was formed on the opposite long side of the body 202, with the fin 202 disposed horizontally between the gate 501 and the body contact 801. The gate 501 and the body contact 801 were electrically connected by a bridge 1501 over the body 202. Because the body 202 is thin between the gate 501 and the body contact 801, the bridge 1501 provided a short, low resistance path. The thin fin 202 body also reduced body-to-source/drain capacitance. The ends of the fin 202, outside of the region of the gate 501 and body contact 801, were appropriately doped to provide source and drain regions. The preferred method for forming these DT CMOS FETs allowed the gate 501 length of the device to have minimum feature size, while allowing the thickness of the fin 202 to be much less than the gate 501 length, preferably less than one-third of the gate length. The preferred method for forming the DT CMOS FET was accomplished by using an image enhancement technique, sidewall image transfer, to define the thickness of the transistor body 202, allowing it to be reliably formed at sub minimum feature size.

While the invention has been particularly shown and described with reference to an exemplary embodiment using a fin type dynamic threshold field effect transistor, those skilled in the art will recognize that the preferred embodiment can be applied to other types of DT CMOS FETs, and that changes in implementation details may be made therein without departing from the spirit and scope of the invention. For example, it will also be understood by those skilled in the art that the invention is applicable to other techniques (other than the fin-based techniques described) for forming thin semiconductor bodies (e.g. V-grooves), as well to different isolation technologies (e.g., LOCOS, recessed oxide (ROX), etc.), dopant types, energies, and species. It will also be understood that the spirit of the invention is applicable to a variety of semiconductor technologies (e.g., BiCMOS, bipolar, silicon on insulator (SOI), silicon germanium (SiGe).

What is claimed is:

1. A transistor comprising:
a) a transistor body formed on a substrate, the transistor body having a first vertical edge and a second vertical edge;
b) a gate structure in a direct mechanical contact with the transistor body first vertical edge;
c) a body contact structure adjacent the transistor body second vertical edge and aligned with the gate structure, a top surface of the gate structure and a top surface of the body contact structure being coplanar, a bottom surface of the gate structure and a bottom surface of the body contact structure being coplanar;
d) a bridge over the transistor body, the gate structure, and the body contact structure, the bridge electrically connecting the gate structure and the body contact structure; and
e) source and drain regions in the transistor body on opposite ends of the transistor body.

2. The transistor of claim 1 wherein the gate structure comprises p-type material and wherein the body contact structure comprises n-type material.

3. The transistor of claim 1 wherein the gate structure comprises n-type material and wherein the body contact structure comprises p-type material.

4. The transistor of claim 1 wherein the transistor body comprises a portion of silicon of the silicon-on-insulator layer.

5. The transistor of claim 1 wherein the thickness of the transistor body between the gate structure and the body contact structure is less than one-third of the length of the gate structure.

6. The transistor of claim 1 wherein the transistor body comprises source and drain implants into the transistor body, the implants aligned with the edges of the body contact structure and the gate structure.

7. The transistor of claim 1 wherein the transistor body first edge is opposite the transistor body second edge and wherein the transistor body first edge and transistor body second edge are substantially perpendicular to a top surface of the substrate.

8. The transistor of claim 1, wherein the bridge is in direct mechanical contact with the gate structure and the body contact structure.

9. The transistor or claim 1, further comprising an insulator on the transistor body and in direct mechanical contact with a top edge of the transistor body, wherein the insulator is disposed between the gate structure and the body contact structure, and wherein the bridge is in direct mechanical contact with the insulator.

10. The transistor of claim 9, wherein a top surface of the insulator is coplanar with the top surface of the gate structure and the top surface of the body contact structure.

11. The transistor of claim 9, wherein the bridge is in direct mechanical contact with the gate structure and the body contact structure.

12. A transistor comprising:
a) a transistor body formed on a substrate, the transistor body having a first vertical edge and a second vertical edge;
b) a gate structure adjacent the transistor body first vertical edge;
c) a body contact structure adjacent the transistor body second vertical edge and aligned with the gate structure;
d) a bridge over the transistor body, the gate structure, and the body contact structure, the bridge electrically connecting the gate structure and the body contact structure;
c) source and drain regions in the transistor body on opposite ends of the transistor body;
e) a gate dielectric between the transistor body first edge and the gate structure; and
g) a diffusion barrier between the transistor body second edge and the body contact structure.

13. A transistor comprising:
a) a transistor body formed on a substrate, the transistor body having a first vertical edge and a second vertical edge;
b) a gala structure adjacent the transistor body first vertical edge;
c) a body contact structure adjacent the transistor body second vertical edge and aligned with the gate structure;
d) a bridge over the transistor body, the gate structure, and the body contact structure, the bridge electrically connecting the gate structure and the body contact structure; and
e) source and drain regions in the transistor body on opposite ends of the transistor body, wherein the transistor body comprises widened end portions that are insulated from the gate structure and the body contact structure.

14. A dynamic threshold complimentary metal oxide semiconductor field effect transistor comprising:
   a) a transistor body, the transistor body formed from a silicon layer formed above an insulator layer, the transistor body having a first vertical edge and a second vertical edge, wherein the transistor body first edge and the transistor body second edge are opposite each other and substantially perpendicular to the insulator layer, thereby defining a fin-type transistor body;
   b) a gate dielectric layer formed on the transistor body first edge;
   c) a body contact native oxide layer formed on the transistor body second edge;
   d) a gate structure formed on the gate dielectric layer adjacent to the transistor body first edge, the gate structure comprising p-type polysilicon; and
   e) a body contact structure formed on the body contact native oxide layer aligned to the gate structure and adjacent to the transistor body second edge, the body contact structure comprising n-type polysilicon.

15. A dynamic threshold complimentary metal oxide semiconductor field effect transistor of claim 14 wherein the gate structure comprises n-type polysilicon and the body contact structure comprises p-type polysilicon.

16. The dynamic threshold complimentary metal oxide semiconductor field effect transistor of claim 14, wherein the transistor body comprises a substantially uniform dopant concentration density in the source and drain regions.

17. The dynamic threshold complimentary metal oxide semiconductor field effect transistor of claim 16 wherein the substantially uniform dopant concentration density is formed by performing a plurality of angled implants into the transistor body.

18. The dynamic threshold complimentary metal oxide semiconductor field effect transistor of claim 14 further comprising a metal silicide bridge over the transistor body to electrically couple the gate structure to the body contact structure.

* * * * *